United States Patent [19]
Lorenz

[11] Patent Number: 6,084,469
[45] Date of Patent: Jul. 4, 2000

[54] MR-PREAMP USING COLLECTOR AND EMITTER COUPLING INTEGRATED CAPACITORS

[75] Inventor: Perry Lorenz, Sunnyvale, Calif.

[73] Assignee: National Semiconductor Corporation, Santa Clara, Calif.

[21] Appl. No.: 09/045,147

[22] Filed: Mar. 20, 1998

[51] Int. Cl.[7] ........................................................ H03F 3/45
[52] U.S. Cl. ........................ 330/252; 330/252; 330/302; 330/303
[58] Field of Search ................................... 330/252, 253, 330/302, 306, 303, 284, 286

[56] References Cited

U.S. PATENT DOCUMENTS 4,710,728  12/1987  Davis ........................................ 330/252

Primary Examiner—Michael B Shingleton
Attorney, Agent, or Firm—Skjerven Morrill MacPherson Franklin & Friel LLP; Edward C. Kwok

[57] ABSTRACT

A circuit and method for lowering the corner frequency of a differential preamplifier having an AC coupling circuit includes a compensation circuit to adjust the frequency response characteristics created by the AC coupling circuit. An RC network in the compensation circuit is configured to provide a canceling zero at the corner frequency of the AC coupling circuit. The RC network also provides a pole at a desired frequency lower than the corner frequency of the AC coupling circuit, in order to define the overall preamplifier corner frequency. The compensation circuit allows the capacitance in the AC coupling circuit to be significantly reduced, eliminating the need for external components or a very large integrated capacitance.

10 Claims, 2 Drawing Sheets

MR-PREAMP USING COLLECTOR AND EMITTER COUPLING INTEGRATED CAPACITORS

BACKGROUND INFORMATION

1. Field of the Invention

The present invention relates to IC preamplifiers, and more particularly, to low noise preamplifiers using capacitive coupling.

2. Relevant Art

In order to read the stored data in a disk drive, a magneto-resistive (MR) head is moved over the surface of the disk. The MR head changes its electrical resistance in response to local variations in magnetic flux. When biased with a constant current, the MR head generates small voltage fluctuations that are representative of the stored data. A differential preamplifier then amplifies the voltage fluctuations to create an output signal that can be used by other components. Because the voltage fluctuations are small, the differential preamplifier must provide low-noise amplification in order to produce an accurate output signal.

Numerous types of differential preamplifiers can be used to generate the output signal. In FIG. 1a, a common base amplifier 170 is shown. In the depicted implementation, an external MR head 120 varies its resistance according a local magnetic flux. A transistor 111 and a transistor 112 form a differential pair, and a transistor 113 and a transistor 114 form a cascode pair. Transistors 111 and 112 are base-coupled by a capacitor 141, while transistors 113 and 114 are connected to a reference voltage Vbb. Biasing for the bases of transistors 111 and 112 is provided by a conventional bias circuit (not shown). A current source 131 provides a bias current for MR head 120 as well as the differential and cascode pairs. Load resistors 115 and 116 convert the bias current into a signal voltage, allowing the voltage across external MR head 120 to be represented at output terminals OUT1 and OUT2. While amplifier 170 provides a relatively simple preamplifier circuit, its gain is limited due to the common base configuration, leading to greater noise susceptibility.

An alternative MR preamplifier 180 shown in FIG. 1b includes transistors 111 and 112 connected as a differential pair. Transistors 113 and 114 are once again a cascode pair. However, current sources 132 and 133 now provide a bias current across MR head 120, creating a voltage differential coupled to the bases of transistors 111 and 112. Current sources 134 and 135 provide biasing for preamplifier 180 in order to produce the appropriate differential output at output terminals OUT1 and OUT2. Because the bias current through MR head 120 typically results in a DC bias of several hundred millivolts, preamplifier 180 must be AC coupled to MR head 120. The AC coupling is provided by an emitter-coupling capacitor connected between the emitters of transistors 111 and 112. However, capacitor 151 introduces a corner frequency fc180, below which the gain of preamplifier 180 begins to roll off. Corner frequency fc180 is defined by the capacitance C151 of capacitor 151 and the emitter resistance Re of transistors 111 and 112. Because the left and right halves of preamplifier 180 are symmetrical, a single ended calculation can be used. Corner frequency fc180 is given by the equation:

$$fc180 = 1/((Re111 * 2 * C151) * 2 * pi) \quad [1]$$

where Re111 is the emitter resistance of transistor 111. A typical MR preamplifier may require a constant gain down to 3.2 Mhz, and a typical emitter resistance will be in the 5 ohm range. Using these numbers, equation 1 indicates that capacitance C151 of capacitor 151 must be:

$$C151 = 1/(3.2\ Mhz * 5\ ohms * 2 * 2 * pi) = 5\ nF$$

However, a 5 nF capacitor is too large to integrate into an IC chip, so capacitor 151 must be implemented as an external component. Besides requiring two extra pins in the final chip package, the wiring used to connect to the external capacitor produces parasitic inductances 152 and 153, which prematurely roll off the high frequency response of preamplifier 180.

In order to avoid the problems associated with an external capacitor, base coupling capacitors can be used. As shown in FIG. 1c, a preamplifier 190 is very similar to preamplifier 180. A differential pair made up of transistors 111 and 112 is biased by a current source 134. A cascode pair formed by transistors 113 and 114 drive load resistors 115 and 116, respectively. Base currents for transistors 111 and 112 are provided by resistors 117 and 118, respectively. An external MR head 120 is biased by current sources 132 and 133. However, AC coupling is no longer provided by an emitter-coupling capacitor. Instead, preamplifier 190 includes base coupling capacitors 161 and 162 at the bases of transistors 111 and 112, respectively. A corner frequency fc190 of preamplifier 190 is now given by:

$$fc190 = 1/((\beta * Re111 * C161) * 2 * pi)$$

where $\beta$ is the current gain of transistor 111, Re111 is the emitter resistance of transistor 111, and C161 is the capacitance of capacitor 161. It should be noted that a single-ended calculation is once again applicable due to the symmetry of preamplifier 190. For a typical transistor current gain of 100, the capacitance C161 required for a 3.2 Mhz low corner frequency is given by:

$$C161 = 1/(3.2\ Mhz * 100 * 5\ ohms * 2 * pi) = 100\ pF$$

Although still relatively large, a pair of 100 pF capacitors can be integrated on to an IC chip, eliminating the need for external components. However, although FIG. 1c only shows two amplification transistors (transistors 111 and 112), a typical preamplifier circuit can include many more parallel amplification transistors. While a single emitter-coupled capacitor could serve the multiple amplification transistors, a separate base-coupling capacitor pair would be required for each amplification transistor.

For either type of AC coupling, it is desirable to provide a circuit for reducing the corner frequency of a preamplifier to a desired level without requiring external components or a very large integrated capacitance.

SUMMARY OF THE PRESENT INVENTION

The present invention provides a circuit and method for lowering the corner frequency of a differential preamplifier that includes an AC coupling circuit, without using an external capacitor or requiring a very large integrated capacitance. A compensation circuit provides a canceling zero at the corner frequency of the AC coupling circuit. This drops the corner frequency of the preamplifier to the frequency of a pole generated by the compensation circuit. By adjusting the values of the components in the compensation circuit, the canceling zero can be matched to the pole of the AC coupling circuit, and the pole generated by the compensation circuit can be set at a desired corner frequency for the preamplifier. The AC coupling circuit can either include an emitter-coupling capacitor or base-coupling capacitors. An implementation of the present invention includes a compensation capacitor coupled across the load resistors of the second stage of the preamplifier. The load resistors are used as compensation resistors to adjust the frequency response curve of the compensation circuit.

BRIEF DESCRIPTION OF THE DRAWINGS

Use of the same reference number in different figures indicates similar or like elements.

DETAILED DESCRIPTION

Figure 1A:
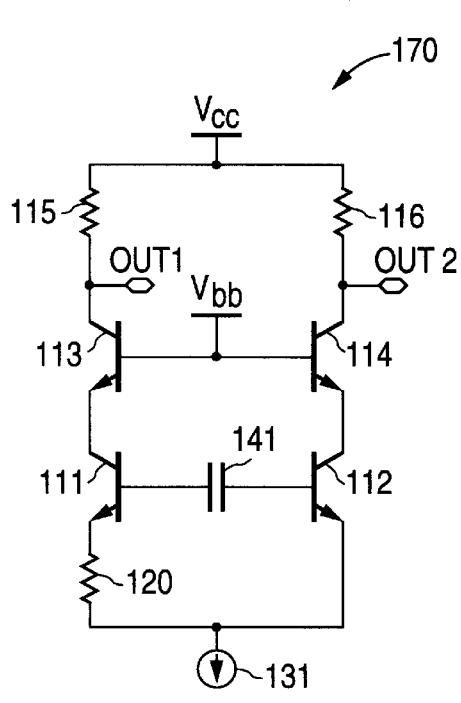
FIG. 1a shows a conventional common base preamplifier.
Figure 1B:
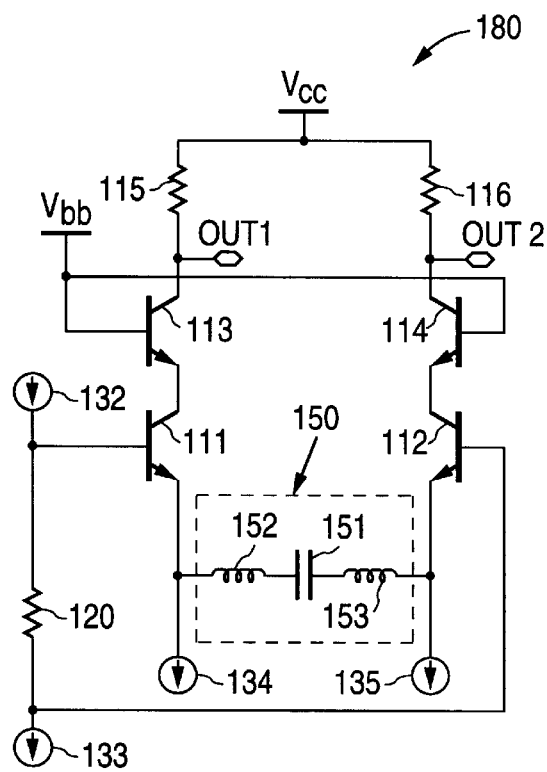
FIG. 1b shows a conventional differential preamplifier using external AC coupling.
Figure 1C:
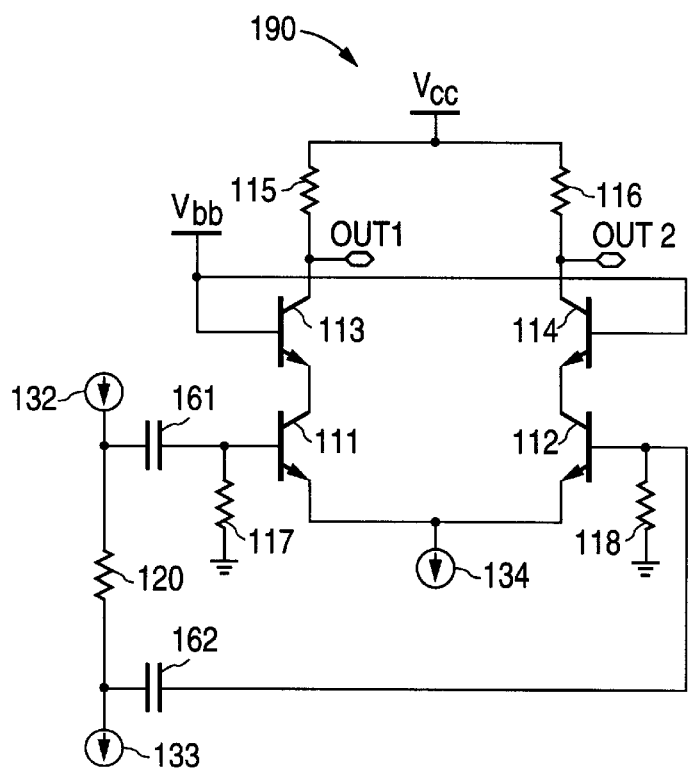
FIG. 1c shows a conventional differential preamplifier using base coupling capacitors.
Figure 2:
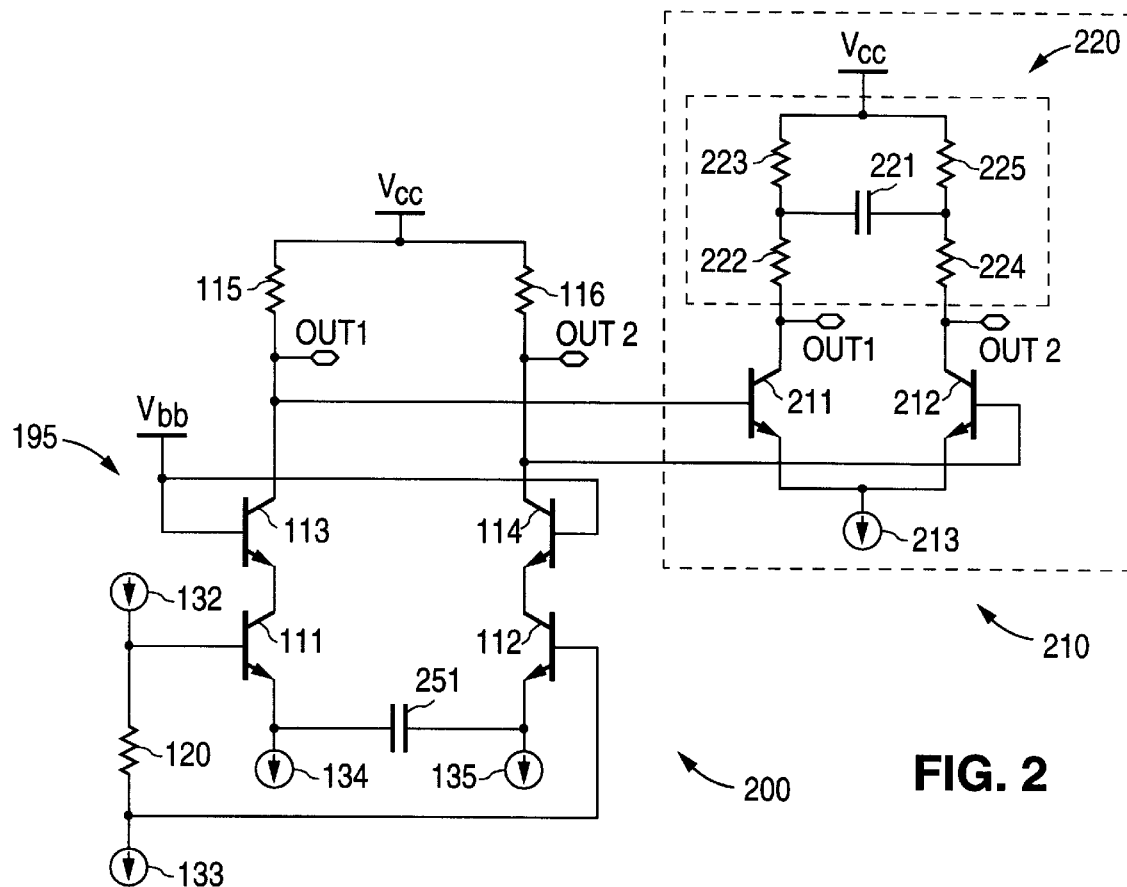
FIG. 2 shows an implementation of the present invention.
Figure 3:
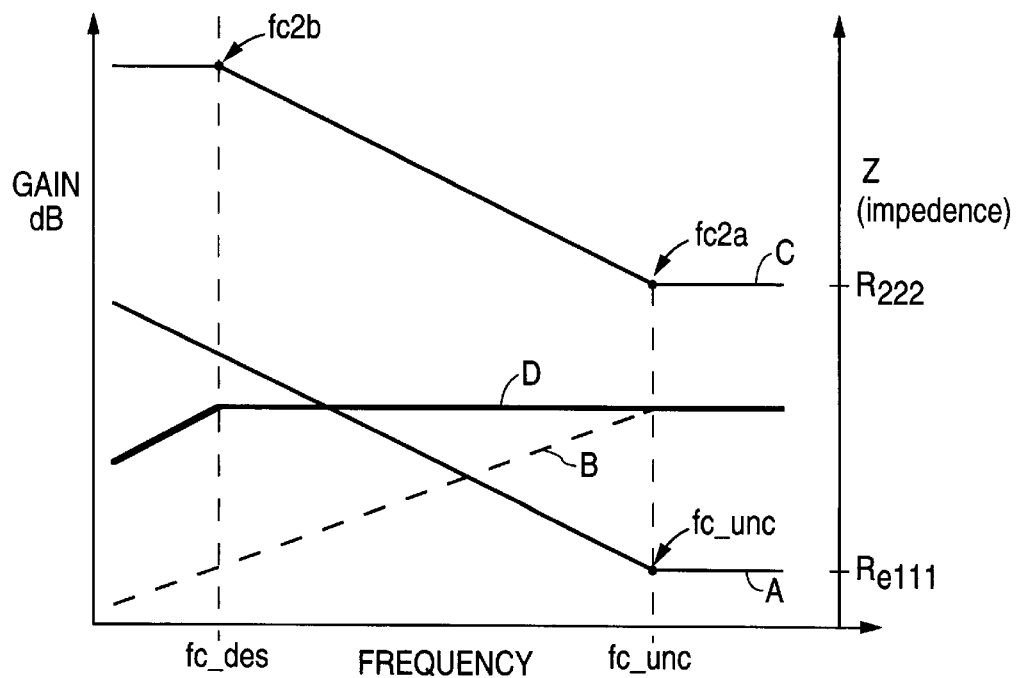
FIG. 3 shows a frequency response plot for the present invention.

The present invention applies a zero-canceling technique to lower the corner frequency of a differential preamplifier using AC coupling. An embodiment of the present invention is shown as a compensation circuit 210 in FIG. 2, and is integrated with a conventional differential preamplifier circuit 195 to form a preamplifier 200. Circuit 195 includes transistors 111 and 112 configured as a differential pair, and transistors 113 and 114 configured as a cascode pair. A differential signal voltage appears across load resistors 115 and 116. An input signal is provided to the bases of transistors 111 and 112 by an external magneto-resistive (MR) head 120 that changes resistance in response to the magnetic flux present in a local medium. A constant bias current is provided to MR head 120 by current sources 132 and 133. While an MR head has been shown in FIG. 2, the signal from any type of variable differential voltage generator can be accommodated. An integrated emitter-coupling capacitor 251 connected between the emitters of transistors 111 and 112 provides AC coupling to the circuit. However, capacitor 251 also imposes its frequency response characteristic on the output of preamplifier 200. A curve A in FIG. 3 provides a graph of impedance versus frequency for the emitter circuit of transistors 111 and 112. The frequency response of the differential pair is inversely proportional to emitter impedance, so without compensation from circuit 210, the output gain would roll off as input frequency fell below an uncompensated corner frequency $fc\_unc$, as shown by a curve B. Using a single-ended calculation made possible by the symmetry of circuit 195, frequency $fc\_unc$ is given by:

$$fc\_unc = 1/((2*C251*Re111)*(2*pi))$$

where C251 is the capacitance of capacitor 251, and Re111 is the emitter resistance of transistor 111. In the case where Re111 is equal to 5 ohms and C251 is equal to 500 pF, which is large for a cost-effective integrated capacitor, corner frequency $fc\_unc$ becomes:

$$fc\_unc = 1/((2*500 \text{ pF}*5 \text{ ohms})*(2*pi)) = 32 \text{ Mhz}$$

This frequency is much higher than a desired corner frequency $fc\_des$ of 3.2 Mhz.

In order to reduce the corner frequency of preamplifier 200 by a factor of 10, the present invention creates a collector impedance profile shown by a curve C in FIG. 3. Curve C has a zero at a frequency fc2a, which is set to equal frequency $fc\_unc$, and a pole at a frequency fc2b, which is set to equal $fc\_des$, the desired corner frequency of preamplifier 200. This produces a collector-to-emitter impedance ratio that maintains a constant level down to frequency fc2b, shifting the frequency response curve of preamplifier 200 from curve B to a curve D. As shown in FIG. 2, this modified collector impedance is provided by compensation circuit 210. The depicted implementation of circuit 210 includes transistors 211 and 212, configured as a differential pair and connected to circuit 195 as a second stage. An RC circuit 220 includes serially-connected compensation resistors 222 and 223, and 224 and 225, connected by a compensation capacitor 221. A first output terminal OUT1 and a second output terminal OUT2 are coupled to the collectors of transistors 211 and 212, respectively, and circuit 210 is biased by a current source 213. The zero generated by circuit 220 occurs at frequency fc2a, which is given by:

$$fc2a = 1/((2*C221*(R222 \| R223))*(2*pi)) \quad [2]$$

where C221 is the capacitance of capacitor 221 and R222 and R223 are the resistances of resistor 222 and resistor 223, respectively. When resistor 222 is much smaller than resistor 223, equation 2 reduces to:

$$fc2a \approx 1/((2*C221*R222)*(2*pi))$$

RC circuit 220 allows capacitor 221 and resistor 222 to be sized for compatibility with conventional manufacturing techniques. For example, in order to create a canceling zero at frequency fc2a equal to frequency $fc\_unc$, capacitance C221 and resistance R222 can be 5 pF and 500 ohms, respectively, giving:

$$fc2a = 1/((2*5 \text{ pF}*500 \text{ ohms})*(2*pi)) = 32 \text{ Mhz} = fc\_unc$$

Then, by giving resistor 223 a resistance R223 of 5000 ohms, pole frequency fc2b is given by:

$$fc2b = 1/((2*C221*R223)*(2*pi)) = 1/((2*5 \text{ pF}*5000 \text{ ohms})*(2*pi)) = 3.2 \text{ Mhz}$$

In this manner, the corner frequency of preamplifier 200 is set to the desired 3.2 Mhz level, since pole frequency fc2b becomes the new corner frequency of preamplifier 200. The remainder of circuit 220 is defined by symmetry as:

$$R224 = R222$$

and $$R225 = R223$$

where R224 is the resistance of resistor 224 and R225 is the resistance of resistor 225. In the described example, the present invention reduces the corner frequency of preamplifier 200 by an order of magnitude without the use of an external capacitor or an impractically large integrated capacitance. In general, given a particular preamplifier, the component values of RC circuit 220 can be modified so that the present invention provides a desired adjustment to the frequency response of the particular preamplifier.

While a specific embodiment of the present invention has been described in detail for explanatory purposes, it will be apparent to those skilled in the art that many modifications and variations are possible, all of which fall within the true spirit and scope of the invention. For example, while compensation circuit 210 is depicted as a second stage of the preamplifier circuit, RC circuit 220 could just as well be implemented in the first stage, or a later stage, of the preamplifier circuit. In addition, compensation circuit 210 would also work with base coupling capacitors for transistors 111 and 112, instead of emitter coupling capacitor 251. Also, the present invention would perform equally well with a preamplifier using MOS devices. Finally, it should be noted that while the present invention has been described using an MR preamplifier, the present invention can be used reduce the corner frequency of any amplifier that incorporates AC coupling.

I claim:

1. An integrated circuit (IC) differential preamplifier comprising:

a first amplifier transistor and a second amplifier transistor configured as a first differential pair, the bases of said first and second transistors providing a pair of input terminals for receiving a differential voltage signal;

an AC coupling circuit connected to said first and second transistors to provide AC coupling, said AC coupling circuit generating a first frequency response for said first differential pair having a first frequency as a corner frequency; and a compensation circuit for lowering the corner frequency of said preamplifier to a second frequency by generating a second frequency response for said differential pair having a canceling zero at said first frequency, and a pole at said second frequency.

2. The preamplifier of claim 1 wherein said compensation circuit comprises:

a first compensation resistor connected in series with a second compensation resistor;

a third compensation resistor connected in series with a fourth compensation resistor; and a compensation capacitor coupled between the junction of said first and second compensation resistors and the junction of said third and fourth compensation resistors;

said first, second, third, and fourth compensation resistors and said compensation capacitor being sized to generate said canceling zero at said first corner frequency and said pole at said desired frequency.

3. The circuit of claim 2 wherein said compensation circuit further comprises a first output transistor and a second output transistor configured as a second differential pair being coupled to said first differential pair as a second output stage of said preamplifier, said first and second compensation resistors being serially coupled to the collector of said first output transistor, and said third and fourth compensation resistors being serially coupled to the collector of said second output transistor.

4. The preamplifier of claim 2, said compensation circuit being incorporated into the first stage of said preamplifier.

5. The preamplifier of claim 2 wherein said AC coupling circuit comprises a coupling capacitor connected between the emitters of said first and second transistors.

6. The preamplifier of claim 2 wherein said AC coupling circuit comprises a first base coupling capacitor and a second base coupling capacitor, said first base coupling capacitor being connected to the base of said first transistor, and said second base coupling capacitor being connected to the base of said second transistor.

7. The preamplifier of claim 6 further comprising a plurality of transistors connected in parallel with said first and second transistors, wherein said AC coupling circuit further comprises a plurality of base-coupling capacitors, one of said plurality of base-coupling capacitors being connected to the base of each of said plurality of transistors.

8. In an IC differential preamplifier including a first input transistor and a second input transistor configured as a differential pair, the bases of said first and second input transistors providing a pair of input terminals for a differential voltage signal, and an AC coupling circuit, a method for lowering a corner frequency of said preamplifier from a first frequency to a second frequency comprising the steps of:

providing a canceling zero at the first frequency of said preamplifier being the corner frequency of the AC coupling circuit; and providing a pole at said second frequency.

9. A circuit for lowering a corner frequency of a differential preamplifier from a first frequency to a second frequency said circuit comprising:

circuitry for providing a canceling zero at the first frequency being the corner frequency of an AC coupling circuit of said differential preamplifier; and circuitry for providing a pole at the second frequency.

10. The circuit of claim 9 wherein said differential preamplifier includes a first output terminal and a second output terminal for providing a differential voltage output, said circuit comprising:

a first compensation resistor connected in series with a second compensation resistor;

a third compensation resistor connected in series with a fourth compensation resistor; and a compensation capacitor coupled between the junction of said first and second compensation resistors and the junction of said third and fourth compensation resistors;

said first, second, third, and fourth compensation resistors and said compensation capacitor being sized to produce said canceling zero and said pole.

* * * * *